US 9,057,626 B2

(12) United States Patent
Agrawal

(10) Patent No.: US 9,057,626 B2
(45) Date of Patent: Jun. 16, 2015

(54) ADVANCED METERING INFRASTRUCTURE (AMI) CARTRIDGE FOR AN ENERGY METER

(75) Inventor: Sachin Agrawal, Utter Pradesh (IN)

(73) Assignee: General Electric Company, Schenectady, NY (US)

(*) Notice: Subject to any disclaimer, the term of this patent is extended or adjusted under 35 U.S.C. 154(b) by 620 days.

(21) Appl. No.: 13/005,826

(22) Filed: Jan. 13, 2011

(65) Prior Publication Data

US 2012/0182006 A1 Jul. 19, 2012

(51) Int. Cl.
| | |
|---|---|
| *G01R 1/04* | (2006.01) |
| *G01D 4/00* | (2006.01) |
| *G06Q 50/06* | (2012.01) |
| *G01R 22/06* | (2006.01) |

(52) U.S. Cl.
CPC ........ *G01D 4/002* (2013.01); *G01R 1/04* (2013.01); *G01D 4/008* (2013.01); *G01R 22/063* (2013.01); *G01R 22/065* (2013.01); *G06Q 50/06* (2013.01); *Y02B 90/241* (2013.01); *Y02B 90/247* (2013.01); *Y04S 20/32* (2013.01); *Y04S 20/50* (2013.01)

(58) Field of Classification Search
CPC ...... G01R 22/065; G01R 22/063; G01R 1/04; G01R 21/00
USPC ................ 324/156, 115; 361/659, 661, 663
See application file for complete search history.

(56) References Cited

U.S. PATENT DOCUMENTS

| | | | | |
|---|---|---|---|---|
| 4,901,007 A | * | 2/1990 | Sworm | 324/110 |
| 5,416,475 A | * | 5/1995 | Tolbert et al. | 340/870.02 |
| 5,511,108 A | | 4/1996 | Severt et al. | |
| 6,798,191 B1 | * | 9/2004 | Macfarlane et al. | 324/157 |
| 6,812,402 B1 | * | 11/2004 | Amerson et al. | 174/541 |
| 8,082,065 B2 | * | 12/2011 | Imes et al. | 700/276 |
| 8,305,232 B2 | * | 11/2012 | Gilbert et al. | 340/870.02 |
| 8,368,386 B2 | * | 2/2013 | Reineccius | 324/142 |
| 8,368,555 B2 | * | 2/2013 | Gilbert et al. | 340/870.09 |
| 8,378,848 B2 | * | 2/2013 | Young et al. | 340/870.07 |
| 8,581,743 B2 | * | 11/2013 | Chan et al. | 340/870.03 |
| 2003/0088374 A1 | | 5/2003 | Slater et al. | |
| 2006/0120028 A1 | | 6/2006 | Kagan et al. | |
| 2007/0067119 A1 | * | 3/2007 | Loewen et al. | 702/57 |
| 2010/0253538 A1 | * | 10/2010 | Smith | 340/870.02 |
| 2011/0115642 A1 | * | 5/2011 | Gilbert et al. | 340/870.02 |
| 2011/0316717 A1 | * | 12/2011 | Young et al. | 340/870.07 |
| 2012/0075777 A1 | * | 3/2012 | Nehete et al. | 361/659 |
| 2012/0086437 A1 | * | 4/2012 | Lin | 324/156 |
| 2012/0126994 A1 | * | 5/2012 | Sobotka et al. | 340/870.02 |
| 2012/0126995 A1 | * | 5/2012 | Sobotka et al. | 340/870.03 |
| 2012/0221718 A1 | * | 8/2012 | Imes et al. | 709/224 |
| 2013/0030591 A1 | * | 1/2013 | Powell et al. | 700/295 |

(Continued)

OTHER PUBLICATIONS

Billion Electric Co., Ltd., Jul. 7, 2010, p. 1-2.*

(Continued)

*Primary Examiner* — Patrick Assouad
*Assistant Examiner* — Lamarr Brown
(74) *Attorney, Agent, or Firm* — Sutherland Asbill & Brennan LLP

(57) ABSTRACT

An advanced metering infrastructure (AMI) cartridge includes an AMI cartridge housing having an interior zone, and an AMI module system supported within the interior zone of the AMI cartridge module housing. The AMI module system includes an AMI module and an energy meter interface configured and disposed to detachably connect to an energy meter.

17 Claims, 4 Drawing Sheets

(56) References Cited

U.S. PATENT DOCUMENTS

2013/0187788 A1* 7/2013 Salter .................. 340/870.02
2013/0226485 A1* 8/2013 Pietrowicz et al. ............ 702/62

OTHER PUBLICATIONS

"Billion Unveils Smart Grid, Energy Management, and Cyber Security Solutions for a Green Planet", May 25, 2010.*
European search report issued in connection with EP Patent Application No. 12150844.4 dated Aug. 5, 2014.
Extended European Search Repot for EP Application No. 12150844. 4-1558, dated Aug. 5, 2014, pp. 1-5.
Richardson, Dave, "Electric Residential Meter Provides Metering Model for Deregulation", Electric Power Research Institute, pp. 1-5; retrieved Sep. 3, 2014; [online] retrieved from the Internet http://www.elp.com/articles/powergrid_international/print/volume-2/issue-5/features/feature/electronic-residential-meter-provides-metering-model-for-deregulation.html Printed date: Sep. 1, 1997.

* cited by examiner

ADVANCED METERING INFRASTRUCTURE (AMI) CARTRIDGE FOR AN ENERGY METER

BACKGROUND OF THE INVENTION

The subject matter disclosed herein relates to the art of energy metering and, more specifically, to an advanced metering infrastructure (AMI) cartridge for an energy meter.

Energy meters are employed to monitor energy consumption from an energy consumer. Traditionally, energy meters simply provided a system for determining how much energy usage should be charged to an energy consumer. In order to gauge energy usage, an energy provider typically employed a meter reader to physically read gauges on the meter and record energy usage for each energy consumer. Over time, meters were provided with advanced meter reading (AMR) technology that communicated directly with an energy provider such as a utility company. AMR included a one-way communication link that sent energy usage data directly to the utility company. More recently, meters have been modified to include advanced metering infrastructure (AMI) technology, which allows for more advanced energy monitoring that includes two-way communication protocols. The two-way communication protocols not only enable utility companies to receive usage data without the need for directly reading a meter but also provide a consumer with usage information that may aid in adjusting energy usage habits. For example, a utility company may provide an energy consumer with instructions on how to adjust usage patterns to take advantage of lower pricing at off-peak times.

BRIEF DESCRIPTION OF THE INVENTION

According to an aspect of an exemplary embodiment, an advanced metering infrastructure (AMI) cartridge includes an AMI cartridge housing having an interior zone and an AMI module system supported within the interior zone of the AMI cartridge housing. The AMI module system includes an AMI module and an energy meter interface configured and disposed to detachably connect to an energy meter.

According to another aspect of the exemplary embodiment, an energy meter includes a meter housing, and an energy usage measuring system arranged within the meter housing. The energy usage measuring system includes an advanced metering infrastructure (AMI) module interface member. An AMI cartridge is operatively connected to the energy usage measuring system. The AMI cartridge includes an AMI cartridge housing including an interior zone, and an AMI module system supported within the interior zone of the AMI cartridge housing. The AMI module system includes an AMI module and an energy meter interface configured and disposed to detachably connect to the AMI module interface member of the energy meter.

According to yet another aspect of the exemplary embodiment, a method of operating an energy meter includes exposing an advanced metering infrastructure (AMI) interface member on the energy meter, connecting an AMI cartridge to the AMI interface member on the energy meter, nesting an AMI cartridge housing into a meter housing of the energy meter, and monitoring energy usage through the energy meter.

These and other advantages and features will become more apparent from the following description taken in conjunction with the drawings.

BRIEF DESCRIPTION OF THE DRAWING

The subject matter, which is regarded as the invention, is particularly pointed out and distinctly claimed in the claims at the conclusion of the specification. The foregoing and other features and advantages of the invention are apparent from the following detailed description taken in conjunction with the accompanying drawings in which:

The detailed description explains embodiments of the invention, together with advantages and features, by way of example with reference to the drawings.

DETAILED DESCRIPTION OF THE INVENTION

Figure 1:
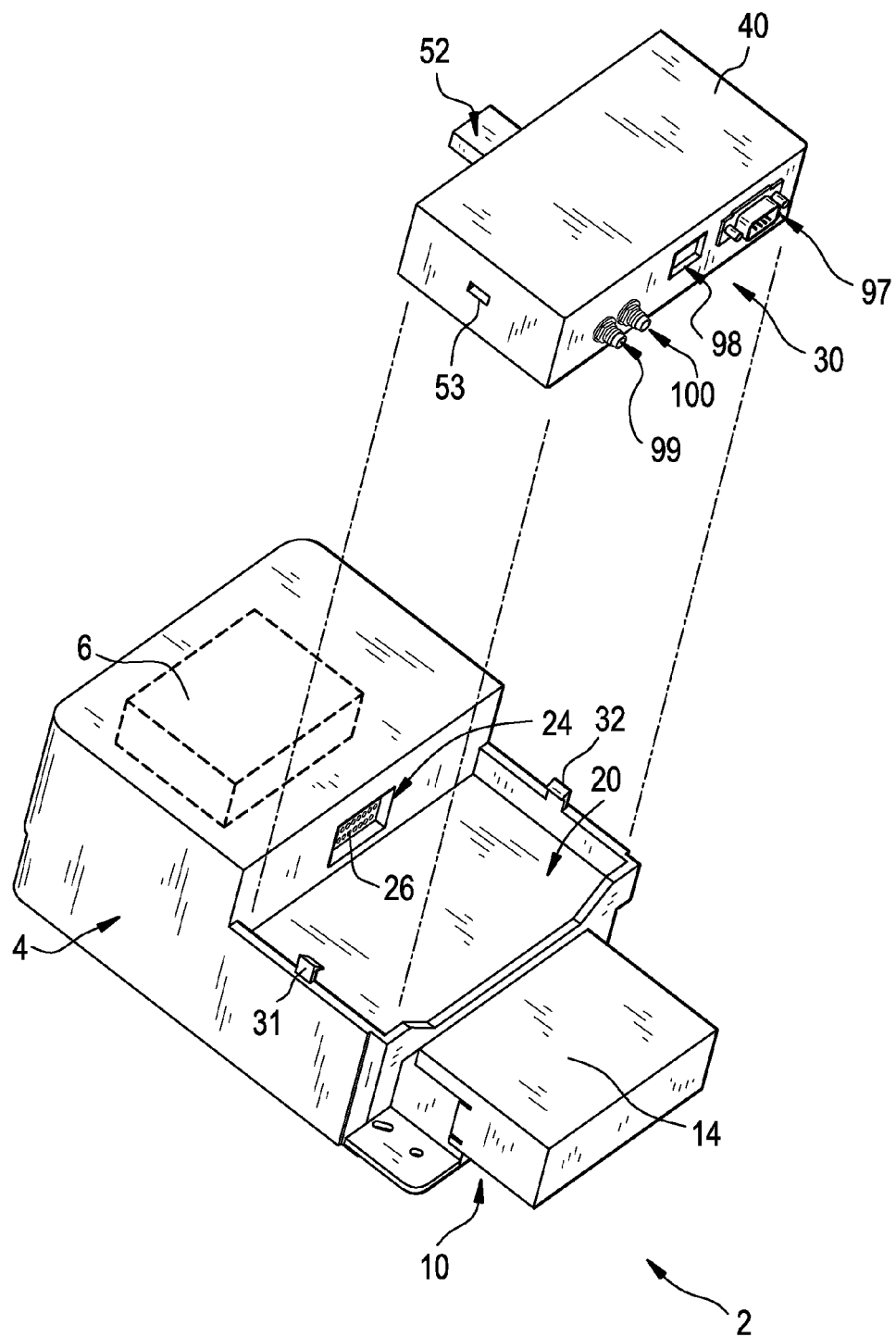
FIG. 1 is a partially exploded view of an energy meter including an advanced metering infrastructure (AMI) cartridge in accordance with an exemplary embodiment.
Figure 2:
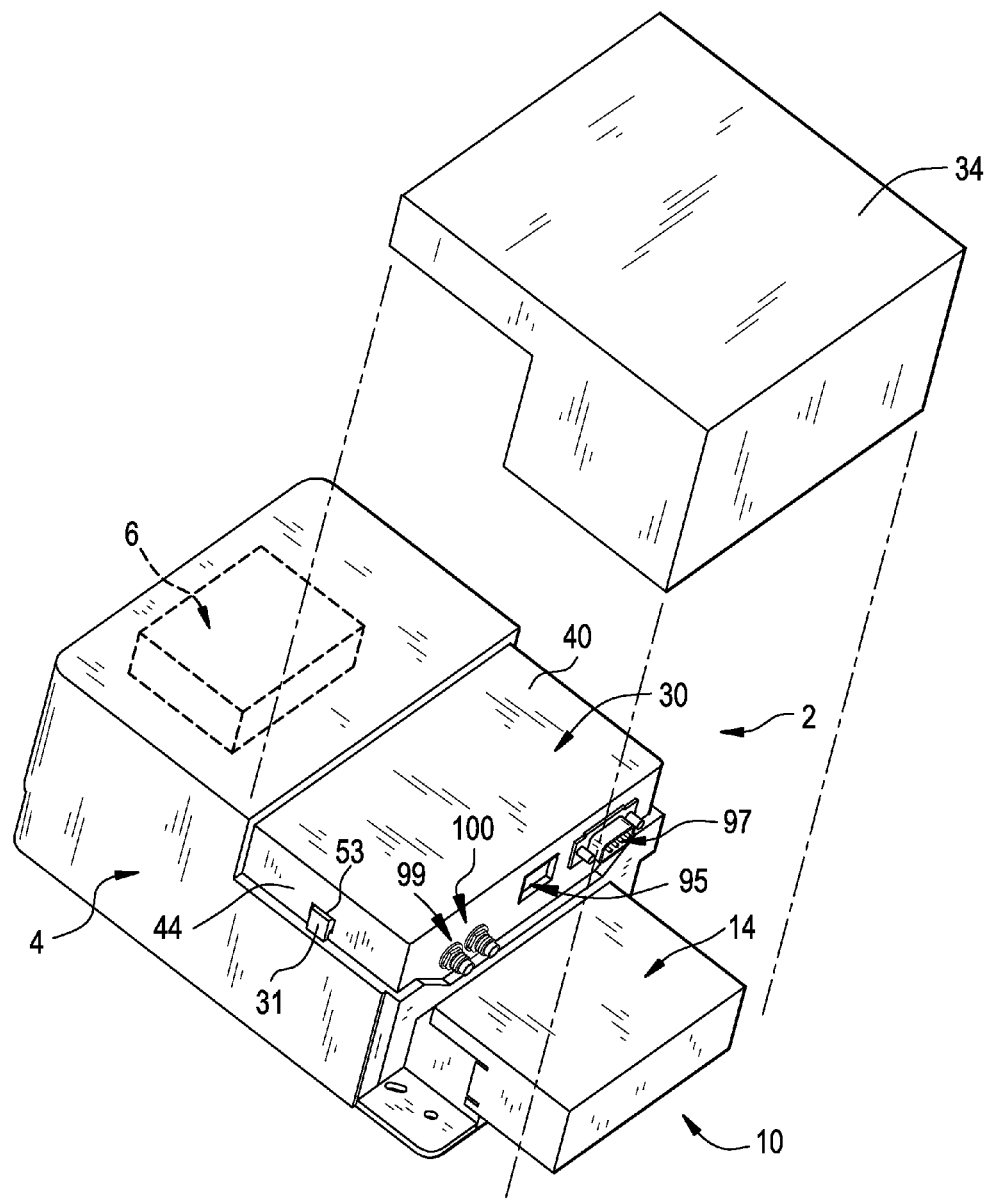
FIG. 2 is a partially exploded view of the energy meter of FIG. 1 illustrating the AMI cartridge nested in an AMI cartridge receiving portion of a meter.

Referencing FIGS. 1 and 2, an energy meter in accordance with an exemplary embodiment is indicated generally at 2. Energy meter 2 includes an energy meter housing 4 that houses an energy meter usage measuring system 6. Energy meter 2 is also shown to include an energy connector portion 10 having a cover member 14 that houses an electrical connection zone (not shown). As such, in the exemplary embodiment shown, energy meter 2 takes the form of an electric meter. However, it should be understood that energy meter 2 can take on a variety of other forms and be configured to measure usage of various energy sources. Energy meter 2 is further shown to include an advanced metering infrastructure (AMI) cartridge receiving portion 20 and an AMI cartridge interface member 24. AMI cartridge interface member 24 includes an AMI module connector 26 which, as will be discussed more fully below, provides an interface to an AMI cartridge 30. AMI cartridge receiving portion 20 is shown to include first and second tab elements 31 and 32 that are arranged to retain AMI cartridge 30. Once connected, AMI cartridge 30 nests within AMI cartridge receiving portion 20 such as shown in FIG. 2. A cover element 34 encloses AMI cartridge receiving portion 20 and provides a protective cover to AMI cartridge 30.

Figure 3:
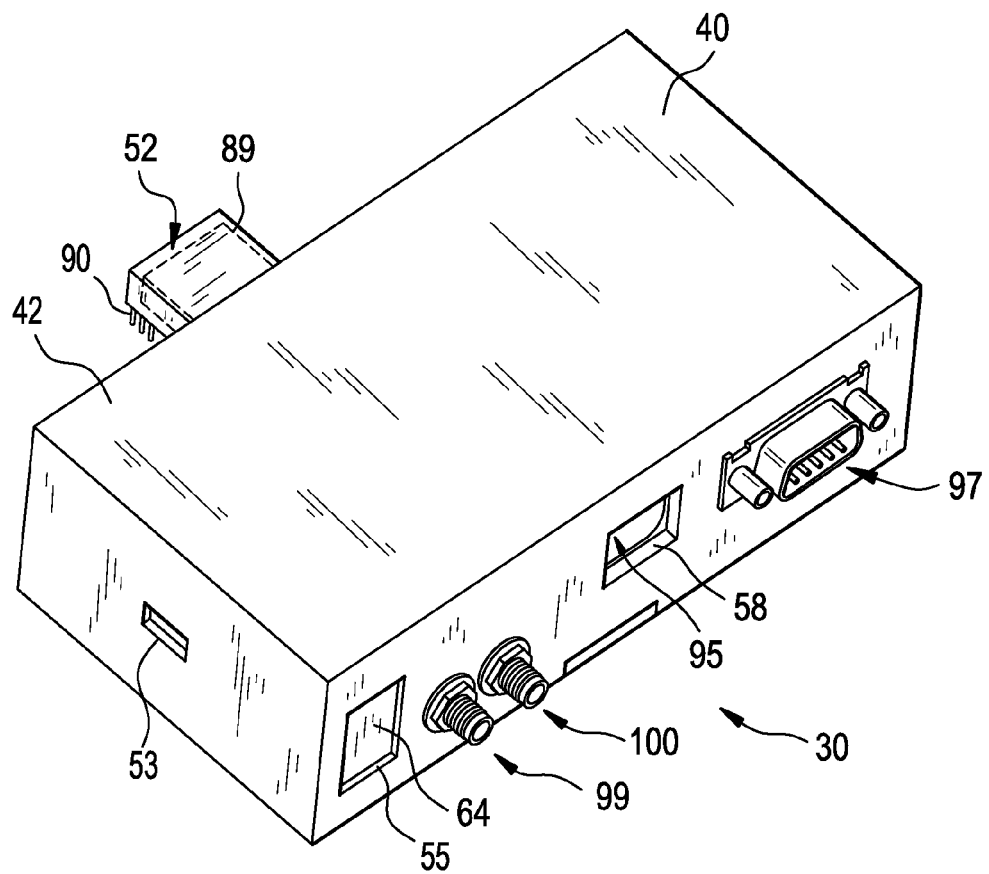
FIG. 3 is a perspective view of the AMI cartridge of FIG. 1.
Figure 4:
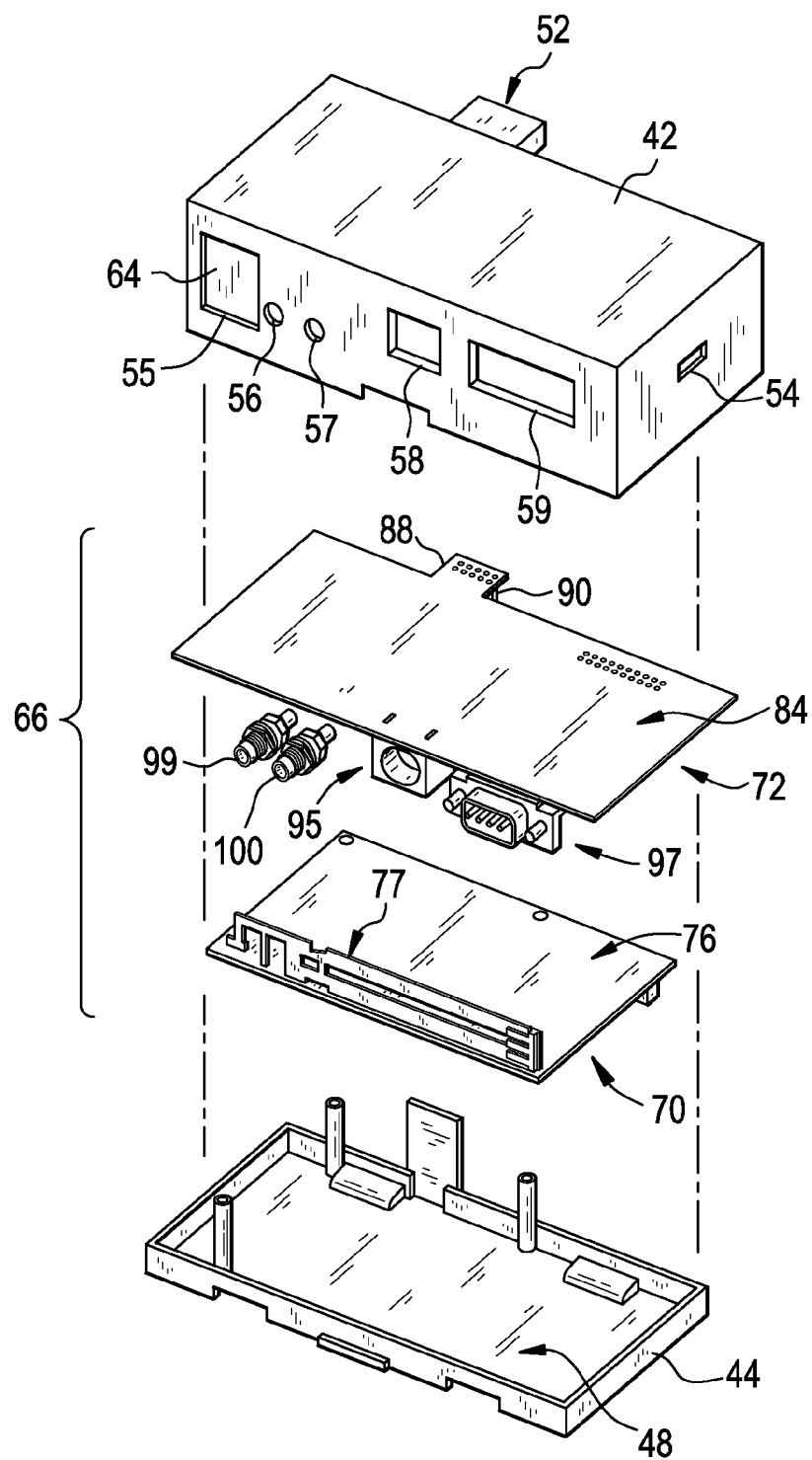
FIG. 4 is an exploded view of the AMI cartridge of FIG. 3.

As best shown in FIGS. 3 and 4, AMI cartridge 30 includes an AMI cartridge housing 40 having a first housing member 42 and a second housing member 44 that, once joined, collectively define an interior zone 48. First housing member 42 includes an energy meter interface member 52 that is configured to register with AMI cartridge interface member 24 on energy meter 2. First housing member 42 also includes a pair of slot elements 53 and 54 that are configured to snap-fittingly engage with corresponding ones of first and second tab elements 31 and 32 on AMI cartridge receiving portion 20. With this arrangement, tab elements 31 and 32 retain AMI cartridge 30 within AMI cartridge receiving portion 20. First housing member 42 is also shown to include a plurality of communication port receiving elements 55-59. Each communication port receiving element 55-59 includes at least one edge portion (not separately labeled) that defines an opening (also not separately labeled) in first housing member 42. Communication port receiving elements 55-59 are configured to receive various types of communication connectors as will be discussed more fully below. If one or more of communication port receiving elements 55-59 are not in use, one or more knock-out elements, such as shown at 64 in connection with communication port receiving element 55, are formed in first housing member 42. Knock out elements 64 can be readily removed to allow installation of a communication port or connector.

AMI cartridge 30 also includes an AMI module system 66 arranged within interior zone 48. AMI module system 66 includes an AMI module 70 that provides various energy usage monitoring functions and an AMI adapter interface 72 that functionally join AMI module 70 to electric meter 2. At this point, it should be understood that while shown as separate components, AMI module 70 and AMI adapter interface 72 could be integrated into a single component. AMI module 70 includes a support surface 76 that is seated upon second housing member 44 and an AMI circuit board 77. AMI circuit board 77 provides various energy usage monitoring functions for energy usage measuring system 6.

AMI adapter interface 72 includes a printed circuit board 84 having an energy meter interface 88 that is provided with an energy meter connector 90. Energy meter interface 88 is covered by energy meter interface member 52 on first housing member 42. Energy meter connector 90, which, in the exemplary embodiment shown, takes the form of a pin connector, is configured to mate with AMI module connector 26 on energy meter 2. AMI adapter interface 72 also includes a plurality of communication ports 95, 97, 99, and 100 that serve as a communication interface with an energy consumer and/or an energy provider. In the exemplary embodiment shown, communication port 95 takes the form of either an RJ-45 port or a sub-miniature version D (DB9) connector, and connector members 99 and 100 take the form of sub-miniature version A connectors. Of course it should be understood that the particular types of communication ports can vary.

With this arrangement, AMI cartridge 30 is readily installed into AMI cartridge receiving portion 20 arranged on a front face of energy meter 2. In the event that changes occur in AMI technology, or a particular energy supplier upgrades AMI features, AMI cartridge 30 is readily replaced in the field with a new or updated AMI cartridge. In this manner, the AMI cartridge, in accordance with the exemplary embodiment, can be readily upgraded, replaced, and/or serviced without the need to disconnect an energy supply and replace an entire meter. Thus, exemplary embodiments provide an AMI cartridge that can be updated/replaced in the field without a disruption in energy supply to an energy consumer. In addition, the AMI cartridge can be made common across a family or families of electric meters, such as SM3000 meters, so as to provide a replacement to both existing and new configurations.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. An advanced metering infrastructure (AMI) cartridge comprising:
   an AMI cartridge housing including an interior zone; and
   an AMI module system supported within the interior zone of the AMI cartridge, the AMI module system including an AMI module and an energy meter interface configured and disposed to detachably connect to an energy meter.

2. The AMI cartridge according to claim 1, further comprising: an adapter interface arranged within the interior zone of the AMI cartridge housing and operatively connected to the AMI module system.

3. The AMI cartridge according to claim 2, wherein the AMI module system includes at least one communication port configured and disposed to communicate with a remote system.

4. The AMI cartridge according to claim 2, wherein the at least one communication port includes one of an RS-232 port, a sub-miniature version D port, an RJ45 port, and a sub-miniature version A port.

5. The AMI cartridge according to claim 1, wherein the AMI cartridge housing includes a first housing member and a second housing member that collectively define the interior zone.

6. The AMI cartridge according to claim 5, wherein the first housing member includes an energy meter interface member that is configured and disposed to matingly engage with an energy meter.

7. The AMI cartridge according to claim 5, wherein the first housing member includes at least one communication port receiving element.

8. The AMI cartridge according to claim 7, wherein the at least one communication port receiving element includes at least one edge portion that defines an opening in the first housing member.

9. The AMI cartridge according to claim 8, wherein the at least one communication port receiving element comprises a plurality of communication port receiving elements formed in the first housing member.

10. The AMI cartridge according to claim 9, further comprising: a knock-out element formed in at least one of the plurality of communication port receiving elements.

11. An energy meter comprising:
    a meter housing;
    an energy usage measuring system arranged within the meter housing, the energy usage measuring system including an advanced metering infrastructure (AMI) module interface member; and
    an AMI cartridge operatively connected to the energy usage measuring system, the AMI cartridge including:
    an AMI cartridge housing including an interior zone; and
    an AMI module system supported within the interior zone of the AMI cartridge housing, the AMI module system including an AMI module and an energy meter interface configured and disposed to detachably connect to the AMI module interface member of the energy meter.

12. The energy meter according to claim 11, wherein the AMI module system includes an adapter interface arranged within the interior zone of the housing and operatively connected to the AMI module.

13. The energy meter according to claim 11, wherein the AMI module system includes at least one communication port configured and disposed to communicate with a remote system.

14. The energy meter according to claim 12, wherein the communication port includes one of an RS-232 port, a sub-miniature version D port, an RJ45 port, and a sub-miniature version A port.

15. The energy meter according to claim 11, wherein the AMI cartridge housing includes a first housing member and a second housing member that collectively define the interior zone.

16. The energy meter according to claim 15, wherein the first housing member includes an energy meter interface member that is configured and disposed to matingly engage with the energy meter.

17. The energy meter according to claim 15, wherein the first housing member includes at least one communication port receiving element.

* * * * *